(12) United States Patent
Takagi et al.

(10) Patent No.: US 7,852,885 B2
(45) Date of Patent: Dec. 14, 2010

(54) LIGHT SOURCE DEVICE AND IMAGE DISPLAY APPARATUS

(75) Inventors: Kunihiko Takagi, Okaya (JP); Akira Egawa, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 11/944,905

(22) Filed: Nov. 26, 2007

(65) Prior Publication Data

US 2008/0123064 A1    May 29, 2008

(30) Foreign Application Priority Data

Nov. 27, 2006    (JP)   ............... 2006-318114
Jul. 4, 2007    (JP)   ............... 2007-175879

(51) Int. Cl.
     *H01S 3/10*    (2006.01)
(52) U.S. Cl. .............. 372/21; 372/22; 372/92; 359/326; 359/328; 359/329
(58) Field of Classification Search .............. 372/21, 372/22; 359/326, 328, 329
See application file for complete search history.

(56) References Cited

U.S. PATENT DOCUMENTS

| | | | |
|---|---|---|---|
| 3,975,693 A | 8/1976 | Barry et al. | |
| 7,339,719 B1 | 3/2008 | Haskett et al. | |
| 7,359,420 B2 * | 4/2008 | Shchegrov et al. | 372/50.124 |
| 2006/0280219 A1 * | 12/2006 | Shchegrov | 372/99 |
| 2006/0280220 A1 * | 12/2006 | Yoo | 372/99 |
| 2007/0053387 A1 * | 3/2007 | Dell'Acqua et al. | 372/21 |
| 2007/0071043 A1 * | 3/2007 | Yamauchi et al. | 372/27 |

FOREIGN PATENT DOCUMENTS

| | | |
|---|---|---|
| CN | 1658450 A | 8/2005 |
| JP | A-2006-511966 | 4/2006 |
| WO | WO 2004/061922 A1 | 7/2004 |

* cited by examiner

*Primary Examiner*—Tod T Van Roy
(74) *Attorney, Agent, or Firm*—Oliff & Berridge, PLC

(57) ABSTRACT

There are provided a light source device and an image display apparatus. The light source device includes a first optical element that deflects a propagation direction of laser beams, a second optical element that separates laser beams, and a third optical element that defects the laser beams separated by the second optical element. The light source device further includes a light emitting unit that has one or more light emitting element emitting laser beams, an external resonator that reflects laser beams toward the first optical element and guides laser beams back to the light emitting unit, and a wavelength converting element that converts laser beams.

16 Claims, 11 Drawing Sheets

LIGHT SOURCE DEVICE AND IMAGE DISPLAY APPARATUS

CROSS-REFERENCE TO RELATED APPLICATION

This application claims priority from Japanese Patent Application No. 2006-318114 filed in the Japanese Patent Office on Nov. 27, 2006, and Japanese Patent Application No. 2007-175879 filed in the Japanese Patent Office on Jul. 4, 2007 the entire disclosures of which are hereby incorporated by reference in their entirety.

BACKGROUND

1. Technical Field

Embodiments of the present invention relate to a light source device and an image display apparatus.

2. Related Art

Recently, in the field of opto-electronics, such as optical communication, optics-applied measurement or optical display, laser light source devices are widely used in which a semiconductor laser light source uses wavelength-converted oscillating light. As an example of such laser light source devices, Japanese Patent Application 2006-511966 (Patent Document 1) suggested an external resonance type laser to realize stable supply of laser beams having a narrow wavelength width. The external resonance type laser is provided with a semiconductor laser oscillator for emitting laser beams of a predetermined wavelength and an external resonator for resonating the laser beams emitted from the laser oscillator. Only laser beams of the predetermined wavelength are allowed to pass therethrough and emitted to the outside.

The external resonance type laser of Patent Document 1 as shown in FIG. 11, however, requires a protruding portion or an L-shaped member that has an external resonance mirror supporting surface and extends above a laser chip 301 (303) from the surface on which the laser chip 301 (303) so as to support, for example, an external resonance mirror 307.

In a particular laser structure in which a wavelength converting element is disposed between the laser chip 301 (303) and the external resonance mirror 307, the external resonance mirror supporting surface needs to be separated from the laser chip 301 (303) by the length of the wavelength converting element. Thus, the length of the protruding portion that protrudes from the laser chip disposed surface to the external resonance mirror supporting surface increases. Further, in the case of a laser array chip, the external resonance mirror 307 needs to have a width greater than the length in the array direction of the chip, and the protruding portion that constitutes the external resonance mirror supporting surface also needs to have a greater width. As a material for a member 305 for disposing the laser chip 301 (303) thereon, metals such as copper having a good heat conductivity are generally used for radiation of heat from the laser chip 301 (303).

On the other hand, the metal member having a long and thick protruding portion or the L-shaped metal member is manufactured by die-case methods or MIM (metal injection molding) methods, which may increase the manufacturing cost. In addition, in the case of realizing the state by using a combination of two separate bodies, a process of bonding the two separate bodies into one body is required, thus complicating the manufacturing works and further increasing the cost. Besides, a large space is required for preparation of such a long and thick convex portion or of the L-shaped member, and it is thus difficult to realize a sufficiently small size (low profile).

SUMMARY

An advantage of some aspects of the embodiments of the present invention is to solve at least some of the above problems. The embodiments can be embodied as the following forms or application examples.

Application Example 1

A light source device, including a light emitting unit that has one or more light emitting element emitting fundamental laser beams in a direction vertical to a light emitting surface; a first optical element that deflects a propagation direction of the fundamental laser beams emitted from the light emitting unit toward a direction substantially parallel to a disposition surface of the light emitting unit; a wavelength converting element that is disposed on an optical path of the fundamental laser beams having passed the first optical element so as to convert at least a portion of the fundamental laser beams into harmonic laser beams; an external resonator that selects the fundamental laser beams among those laser beams having passed the wavelength converting element so that the fundamental laser beams selected are reflected toward the first optical element and guided back to the light emitting unit, thereby functioning as a resonator mirror for the light emitting unit, while allowing the harmonic laser beams to pass therethrough; a second optical element that separates those laser beams having passed the wavelength converting element after being reflected from the external resonator into the harmonic laser beams that are converted by the wavelength converting element and the fundamental laser beams; and a third optical element that deflects the propagation direction of the harmonic laser beams that are separated by the second optical element toward a direction substantially parallel to the disposition surface of the light emitting unit.

According to such an arrangement, the use of the first optical element obviates the necessity of the long and thick convex portion or the L-shaped member for supporting the external resonator or the wavelength converting element. Moreover, the light emitting unit, the optical elements, and the external resonator are disposed and fixed to a base plate from the same direction, providing good workability at the time of manufacturing while decreasing manufacturing cycle time. In addition, the use of the second and third optical elements enables extraction of the harmonic laser beams returning back to the light emitting unit after being converted by the wavelength converting element in a more efficient manner than the case in which the harmonic laser beams are allowed to be reflected from the surface of the light emitting element. Accordingly, it is possible to simplify the configuration of the light source device while decreasing the manufacturing cost. Also, the device can have a low profile and high efficiency.

Application Example 2

The light source device, wherein the second optical element is a wavelength separating film.

According to such an arrangement, it becomes easy to separate laser beams in an efficient manner and at low cost.

Application Example 3

The light source device, wherein the wavelength separating film has a polarization selecting function for making the ratio of output beams to input beams of the fundamental laser beams different from each other in two polarization components having different polarization directions.

According to such an arrangement, the polarization direction of the fundamental laser beams can be arranged. Accordingly, it is possible to increase light utilization efficiency when the light source device is used in combination with devices such as liquid crystals in which polarization is controlled.

Application Example 4

The light source device, wherein the polarization direction associated with a higher ratio in the polarization selecting function of the wavelength separating film is substantially identical to a polarization direction of the wavelength converting element.

According to such an arrangement, only the laser beams having the polarization direction associated with a high conversion efficiency of the wavelength converting element are oscillated. Accordingly, it is possible to increase the conversion efficiency of the wavelength converting element.

Application Example 5

The light source device, wherein the first optical element is a first prism having an isosceles right triangular section, wherein the third optical element is a second prism having an isosceles right triangular section, and wherein the first prism and the second prism are fixedly secured to each other with the wavelength separating film disposed therebetween.

According to such an arrangement, it becomes easy to change the propagation direction of laser beams in an efficient manner and at low cost.

Application Example 6

The light source device, wherein a surface on the light emitting element side of the first prism is provided with an anti-reflection film that suppress the fundamental laser beams from being reflected from the first prism when the fundamental laser beams are incident on the first prism after being emitted or reflected from the light emitting element.

According to such an arrangement, it is possible to suppress laser beams from being reflected from the prism surface in the vicinity of the light emitting element and thus to stabilize the oscillation of laser beams by the light emitting element and the external resonator.

Application Example 7

The light source device, wherein the first and third optical elements are configured as a mirror.

According to such an arrangement, it becomes easy to change the propagation direction of laser beams in an efficient manner and at low cost.

Application Example 8

The light source device, wherein positions of the first to third optical elements, the wavelength converting element, and the external resonator relative to the light emitting element of the light emitting unit are determined by a position determining member disposed on the disposition surface of the light emitting unit.

According to such an arrangement, it becomes easy to perform a position determining operation in an efficient manner.

Application Example 9

The light source device, wherein the position determining member is a pin.

According to such an arrangement, it becomes easy to perform a position determining operation in an efficient manner and at low cost.

Application Example 10

An image display apparatus, including: the light source device described above; a light modulating device that modulates laser beams emitted from the light emitting device in accordance with image signals; and a projecting device that projects images formed by the light modulating device.

According to such an arrangement, the use of the first optical element obviates the necessity of the long and thick convex portion or the L-shaped member for supporting the external resonator or the wavelength converting element. Moreover, the light emitting unit, the optical elements, and the external resonator are disposed and fixed to a base plate from the same direction, providing good workability at the time of manufacturing while decreasing manufacturing cycle time. In addition, the use of the second and third optical elements enables extraction of the harmonic laser beams returning back to the light emitting unit after being converted by the wavelength converting element in a more efficient manner without needing to pass the harmonic laser beams through the wavelength converting element and the external resonator. Accordingly, it is possible to simplify the configuration of the image display apparatus while decreasing the manufacturing cost. Also, the apparatus can have a low profile and high efficiency.

Application Example 11

An image display apparatus, including: the light source device described above; and a scanning unit that scans the harmonic laser beams emitted from the light source device onto a projection surface.

According to such an arrangement, the use of the first optical element obviates the necessity of the long and thick convex portion or the L-shaped member for supporting the external resonator or the wavelength converting element. Moreover, the light emitting unit, the optical elements, and the external resonator are disposed and fixed to a base plate from the same direction, providing good workability at the time of manufacturing while decreasing manufacturing cycle time. In addition, the use of the second and third optical elements enables extraction of the harmonic laser beams returning back to the light emitting unit after being converted by the wavelength converting element in a more efficient manner without needing to pass the harmonic laser beams through the wavelength converting element and the external resonator. Accordingly, it is possible to simplify the configuration of the image display apparatus while decreasing the manufacturing cost. Also, the apparatus can have a low profile and high efficiency.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments of the invention will be described with reference to the accompanying drawings.

First Embodiment

Figure 1:
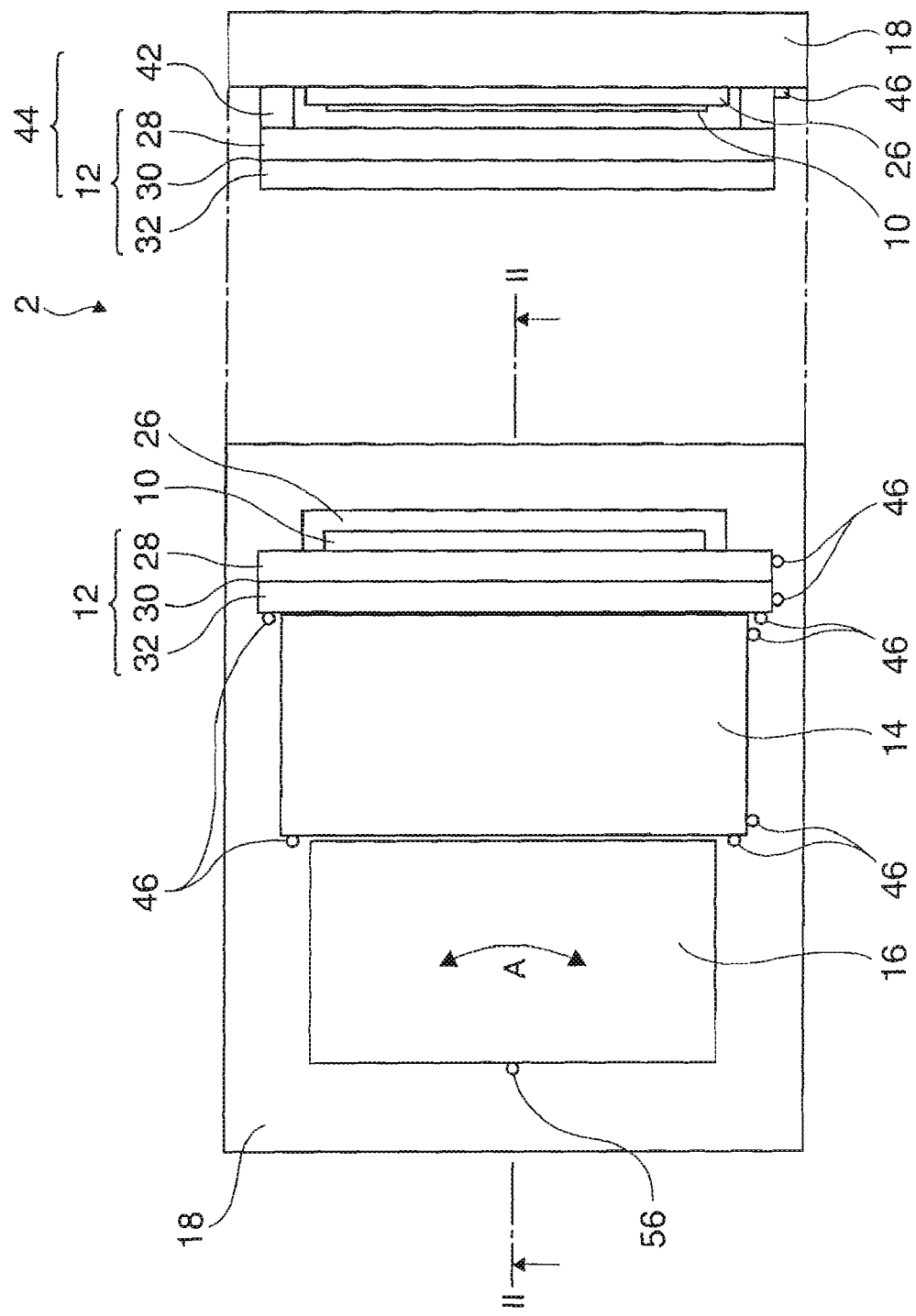
FIG. 1 shows a plan view and a side view of a light source device in accordance with a first embodiment.
Figure 2:
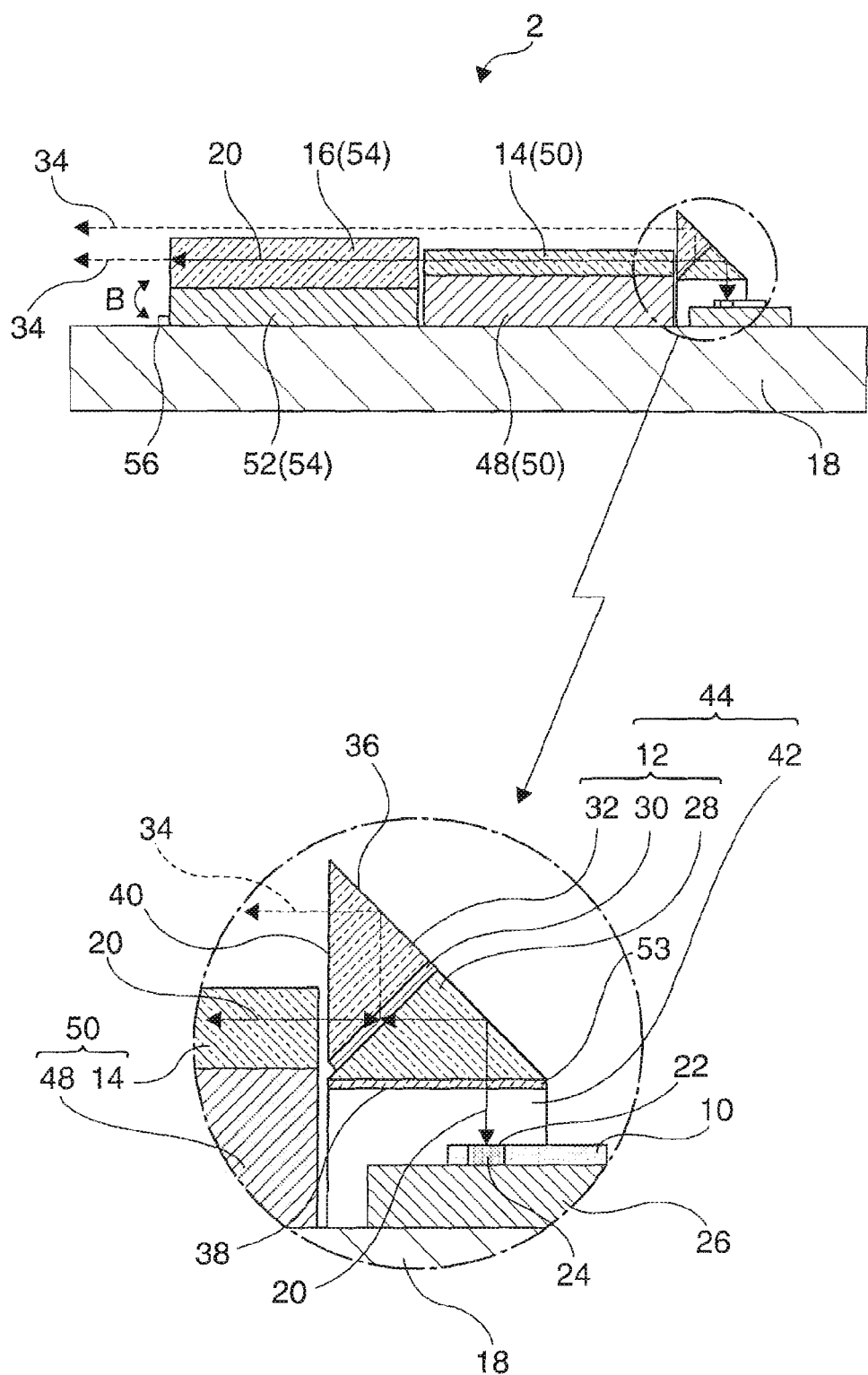
FIG. 2 shows a sectional view taken along the line II-II of FIG. 1.

FIG. 1 shows a plan view and a side view of a light source device in accordance with a first embodiment. FIG. 2 shows a sectional view taken along the line II-II of FIG. 1. As shown in FIG. 1, the light source device 2 of the present embodiment includes a light emitting unit 10, an optical element 12, a wavelength converting element 14, an external resonator 16, and a base plate 18.

The light emitting unit 10 is supported by a support member 26, as shown in FIG. 2. The light emitting unit 10 includes one or more light emitting element (surface emission type semiconductor laser) 24 that emits fundamental laser beams 20 in a direction vertical to a light emitting surface 22. The light emitting unit 10 emits one or a plurality of fundamental laser beams 20. Semiconductor lasers, solid-state lasers, or the like are usable as the light emitting element 24.

The optical element 12 is disposed on an optical path of the fundamental laser beams 20 that are emitted by the light emitting element 24 that constitutes the light emitting unit 10. The optical element 12 includes a first prism 28 as a first optical element, a wavelength separating film 30 as a second optical element, and a second prism 32 as a third optical element.

The first prism 28 deflects a propagation direction of the fundamental laser beams 20 that are emitted from the light emitting unit 10 having one or more light emitting element 24 emitting the fundamental laser beams 20 in a direction vertical to the light emitting surface 22 toward a direction substantially parallel to a disposition surface of the light emitting unit 10.

A disposition surface of a spacer 42 of the first prism 28 is provided with an anti-reflection film 53 that suppress the fundamental laser beams 20 from being reflected from the first prism 28 when the fundamental laser beams 20 are incident on the first prism 28 after being emitted or reflected from the light emitting element 24. The anti-reflection film 53 is an AR (anti-reflection) coating, for example. The AR coating is formed to have an angle and properties for preventing reflection on the incidence surface by coating the disposition surface of the spacer 42 of the prism 12 with two or more thin films having different refractive indices. With such an arrangement, it becomes possible to suppress the fundamental laser beams 20 from being reflected from the disposition surface of the spacer 42 of the prism 12 in the vicinity of the light emitting element 24. Thus, it is possible to suppress the reflected fundamental laser beams 20 from having a bad influence on the light emitting element 24 and thus to stabilize the oscillation of laser beams by the light emitting element 24 and the external resonator 16. Besides, the anti-reflection film 53 may be provided with silica coatings or AR panels. The silica coatings are realizable at low cost since they are formed by welding fine silica particles on a anti-reflection surface to form micro-unevenness thereon so that external light beams are reflected on the anti-reflection surface in a diffused manner. The AR panels are obtained by bonding a special anti-reflection film onto the anti-reflection surface.

The wavelength separating film 30 separates laser beams having passed the wavelength converting element 14 after being reflected by the external resonator 16 into harmonic laser beams 34 that are converted by the wavelength converting element 14 and the fundamental laser beams 20. With such an arrangement, it becomes easy to separate laser beams in an efficient manner and at low cost.

The wavelength separating film 30 has a polarization selecting function for making the ratio of output beams to input beams of the fundamental laser beams 20 different from each other in two polarization components having different polarization directions. The wavelength separating film 30 having the polarization selecting function is formed to have such an angle and properties that the ratio of output beams to input beams of the fundamental laser beams 20 is different from each other in two linearly polarized beams included in the fundamental laser beams 20, that is, between P-polarization beams and S-polarization beams that are perpendicular to each other. The wavelength separating film 30 is formed of a dielectric multilayer film. The dielectric multilayer film can be formed, for example, from $SiO_2$, $ZrO_2$, or $TiO_2$ using a CVD process. The thickness and material of each layer of the multilayer and the number of layers in the multilayer are optimized in accordance with properties that are required. With such an arrangement, the polarization direction of the fundamental laser beams can be arranged, and it is thus possible to increase light utilization efficiency when the light source device is used in combination with devices such as liquid crystals in which polarization is controlled. In additions the polarization direction associated with a higher ratio in the polarization selecting function of the wavelength separating film 30 is substantially identical to a polarization direction of the wavelength converting element 14.

Figure 3:
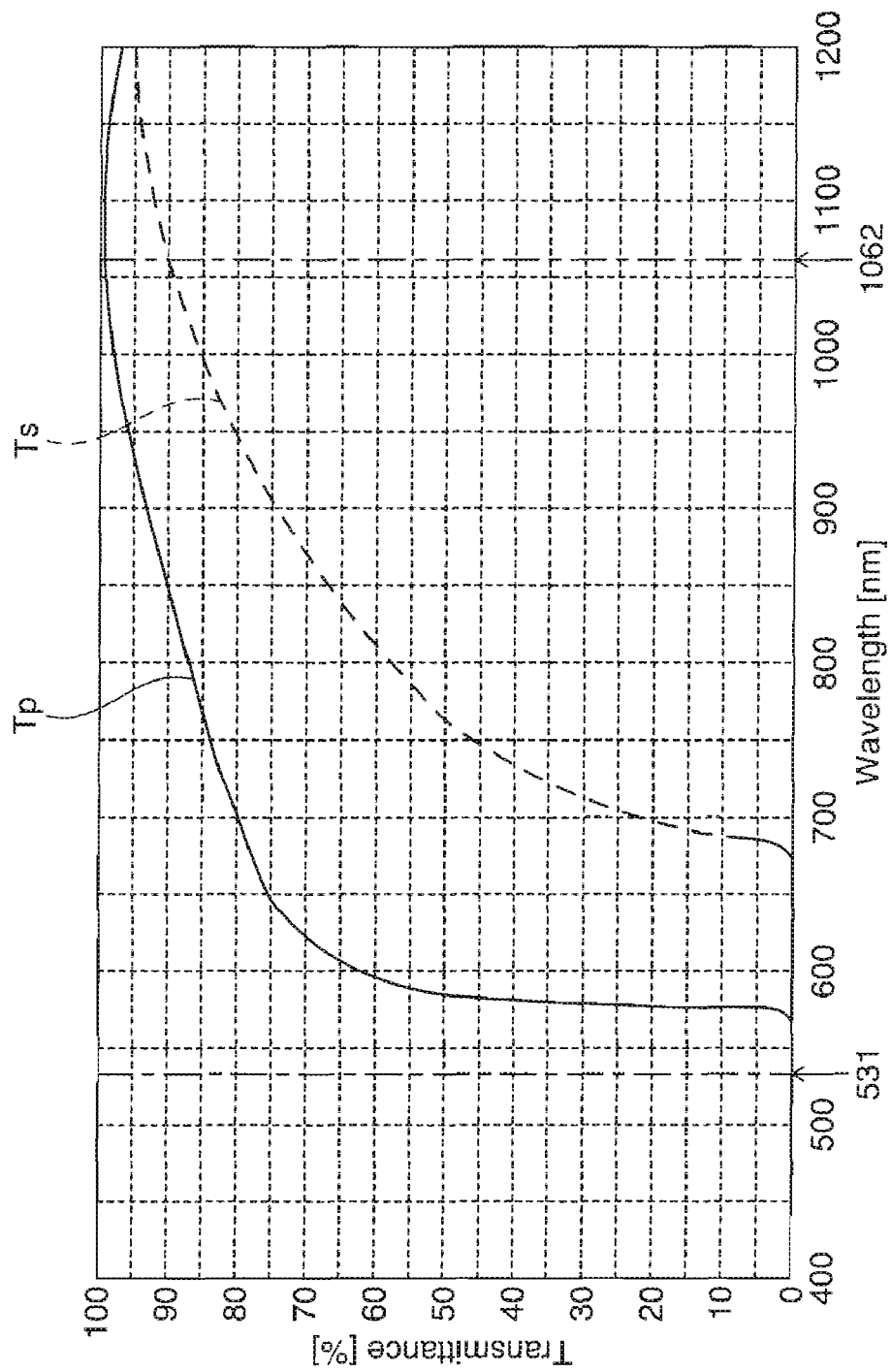
FIG. 3 shows a graph for illustrating the characteristics of a polarization selecting function of a wavelength separating film of the first embodiment.

FIG. 3 shows a graph for illustrating the characteristics of a polarization selecting function of a wavelength separating film 30 of the first embodiment. The horizontal axis shows the wavelength of laser beams incident on the wavelength separating film 30. The vertical axis shows transmittance of the linearly polarized beams included in the laser beams incident on the wavelength separating film 30 (transmittance of P-polarization beams and S-polarization beams is depicted by Tp and Ts, respectively). Here, the transmittance shows a ratio of an emitted laser beam to the incident laser beam. As illustrated in FIG. 3, the wavelength separating film 30 is configured such that the P-polarization beams and the S-polarization beams have different transmittances when passing through the wavelength separating films 30, as indicated by Tp and Ts in the drawing, respectively. For example, in the case of the fundamental laser beams having a wavelength in the vicinity of 1062 nm, the transmittance of the P-polarization beams Tp is more than about 8 percent higher than that of the S-polarization beams Ts. In the present embodiment, the polarization direction of the P-polarization beams Tp is configured so as to be substantially identical to the polarization direction of the wavelength converting element 14. Accordingly, only the polarization beams of the strong laser beams having the polarization direction associated with a high conversion efficiency of the wavelength converting element 14 are oscillated, and it is thus possible to increase the conversion efficiency of the wavelength converting element 14.

In the wavelength separating film 30, the transmittance of the laser beams having a wavelength in the vicinity of 531 nm is set to 0. Laser beams in the vicinity of this wavelength are reflected from the wavelength separating film 30. In the present embodiment, the wavelength separating film 30 is formed to have such properties that laser beams having passed the wavelength converting element 14 after being reflected by the external resonator 16 are separated into the harmonic laser beams 34 that are converted by the wavelength converting element 14 and the fundamental laser beams 20. Although in the present embodiment, the wavelength separating film 30 is provided with a polarization separating function, the polarization separating function may not be provided to the wavelength separating film 30. In this case, an optical film having the polarization separating function may be separately provided to a surface of the second prism 32 including a side 40, through which the fundamental laser beams 20 are allowed to pass.

The second prism 32 deflects the propagation direction of the harmonic laser beams 34 that are separated by the wavelength separating film 30 in a direction substantially parallel to the disposition surface of the light emitting unit 10 without needing to pass the harmonic laser beams 34 through the wavelength converting element 14 and the external resonator 16. As the first and second prisms 28 and 32, existing prisms made from optically transparent materials such as a glass or transparent resin having a refractive index greater than that of atmospheric air are applicable. The first and second prisms 28 and 32 are configured as a right angle prism having an isosceles right triangular section.

The optical element 12 is a prism 12 constituted by the first prism 28 and the second prism 32 in which the first prism 28 and the second prism 32 are fixedly secured to each other with the wavelength separating film 30 disposed therebetween. More specifically, the wavelength separating film 30 is formed on the second prism 32 and is fixed to the first prism 28 by means of an adhesive layer (not shown). Such an arrangement is preferable in that it can suppress loss of the harmonic laser beams 34 by making it possible to deflect the propagation direction of the harmonic laser beams 34 without needing to pass the harmonic laser beams through the adhesive layer.

The prism 12 is configured as a right angle prism having an isosceles right triangular section. The fundamental laser beams 20 and the harmonic laser beams 34 being incident in a vertical direction to a surface of the prism 12 including the shorter sides 38 and 40 of the isosceles right triangular section are reflected from a laser beam reflective surface of the prism 12 including the longer side 36. The surface of the prism 12 including the side 38 of the isosceles right triangular section is disposed and fixed to the base plate 18 by means of the spacer 42. The prism 12 and the spacer 42 are bonded to each other by means of adhesion or the like to constitute a prism assembly 44. The surface of the prism 12 including the side 40 of the isosceles right triangular section is opposed to the wavelength converting element 14.

The laser beams reflected by the external resonator 16 are incident on the surface of the prism 12 including the side 40 after passing through the wavelength converting element 14. Among the laser beams being incident on the surface of the prism 12 including the side 40, the harmonic laser beams 34 are selected by the wavelength separating film 30 so as to be separated from the fundamental laser beams 20. The separated harmonic laser beams 34 are outputted from the surface of the prism 12 including the side 40 after being reflected from the laser beam reflective surface of the prism 12 including the longer side 36.

The wavelength separating film 30 provided inside the prism 12 for separation of the wavelength-converted harmonic laser beams 34 obviates return of guiding the wavelength-converted harmonic laser beams 34 back to the light emitting element 24. Accordingly, it is possible to eliminate the effect of the harmonic laser beams 34 being absorbed into the surface of the light emitting element 24, thereby enabling to use the harmonic laser beams 34 in an efficient manner. In addition, it becomes easy to change the propagation direction of laser beams in an efficient manner and at low cost. In the present embodiment, the prism 12 is configured to extract the harmonic laser beams 34 without needing to pass the harmonic laser beams through the wavelength converting element 14 and the external resonator 16. Accordingly, it is possible to use the harmonic laser beams 34 in an efficient manner without any attenuation of the harmonic laser beams 34 due to a phenomenon such as surface reflection or scattering or absorption in surfaces which may be caused by the wavelength converting element 14 and the external resonator 16. By using the prism 12, it becomes easy to obtain a highly precise reflection angle of the laser beam reflective surface. In addition, the laser beam reflecting surface of the prism 12 including the longer side 36 of the isosceles right triangular section may be provided with an optical film that reflects laser beams.

The wavelength converting element 14 is disposed on an optical path of the fundamental laser beams 20 established between the prism 12 and the external resonator 16. The wavelength converting element 14 is disposed and fixed to the base plate 18 by using a position determining member 46 (see FIG. 1). The wavelength converting element 14 and a wavelength converting element holder 48 are bonded to each other by means of adhesion or the like to constitute a wavelength converting element assembly 50.

The wavelength converting element 14 is an element that converts the wavelength of the fundamental laser beams 20 emitted from the light emitting element 24. As the wavelength converting element 14, non-linear optical crystals are usable, for example. The wavelength converting element 14 is a non-linear optical element that converts incident laser beams so as to have a wavelength about a half of the original wavelength.

The wavelength converting element 14 converts at least a portion of the fundamental laser beams 20 having passed the prism 12 into the harmonic laser beams 34. The wavelength converting element 14 converts the wavelength of the fundamental laser beams 20 having passed the prism 12. The wavelength converting element 14 converts the fundamental laser beams 20 emitted from the light emitting element 24 so as to have a wavelength about a half of the original wavelength and outputs the wavelength-converted fundamental laser beams 20 therefrom. The laser beams being guided to the external resonator 16 after being emitted from the light emitting element 24 are converted so as to have a wavelength about a half oaf the original wavelength after passing through the wavelength converting element 14. For example, when the fundamental laser beams 20 having a wavelength of 1064 nm are incident on the wavelength converting element 14 from the light emitting element 24, laser beams having a wavelength of 532 nm are outputted from the wavelength converting element 14. The wavelength conversion efficiency of the wavelength converting element 14 has non-linear characteristics. For example, higher conversion efficiency is obtainable as the intensity of laser beams incident on the wavelength converting element 14 increases. The conversion efficiency of the wavelength converting element 14 is about 30 to 50%. That is, only some of (not the entirety of) the fundamental laser beams 20 emitted from the light emitting element 10 are converted into laser beams having a predetermined wavelength.

A temperature control unit (not shown) is disposed in the wavelength converting element holder 48 so as to maintain the wavelength converting element 14 at a proper temperature. Specific examples of the temperature control unit include a peltier element, a thermistor for detecting a heat source called heater and a temperature thereof, a platinum resistor, a thermocouple, or the like.

The external resonator 16 is disposed on the optical path of the fundamental laser beams 20 emitted from the light emitting element 24. The external resonator 16 and an external resonator holder 52 are bonded to each other by means of adhesion or the like to constitute an external resonator assembly 54. When the position of the external resonator assembly 54 is adjusted in two directions as indicated by the arrow A (FIG. 1) and the arrow B (FIG. 2), it becomes possible to properly adjust the propagation direction (light intensity) of the fundamental laser beams 20 returning back to the light emitting element 24 via the wavelength converting element 14 after being reflected by the external resonator 16. For adjustment in two directions as indicated by the arrows A and B, the position of the external resonator assembly 54 is determined by one position determining member 56. The position determining member 56 is fixed by means of an adhesive after the two-directional adjustment of the external resonator assembly 54 is performed by a robot or the like.

The external resonator 16, although not shown in the drawing, is formed on a substrate having optically transparent properties, in which a plurality of films are sequentially stacked on the substrate. As a material for the substrate, a glass is usable, for example. As a material for the films, $SiO_2$ is usable, for example. In addition, the kinds of each layer and the number of layers constituting the external resonator 16 are suitably selected in accordance with properties that are desired. For example, as the external resonator 16, optical elements such as a hologram element having periodic gratings are usable in which volume phase gratings are formed in the substrate having optically transparent properties, the details of which are well known in the art and therefore will not be explained herein. Although in the present embodiment, the external resonator 16 is used in which the volume phase gratings are formed in the substrate having optically transparent properties, the external resonator may be used in which a mirror and a band-pass filter are formed besides the volume phase gratings.

The external resonator 16 selects the fundamental laser beams 20 so as to be reflected toward the prism 12 and guided back to the light emitting unit 10, thereby functioning as a resonator mirror for the light emitting unit 10, while allowing the harmonic laser beams 34 to pass therethrough. Specifically, the external resonator 16 allows the harmonic laser beams 34 of a particular wavelength range that are converted by the wavelength converting element 14 to pass therethrough, while allowing the fundamental laser beams 20 of a particular wavelength range to be reflected therefrom. The fundamental laser beams 20 being reflected by the external resonator 16 returns back to the light emitting element 24 after passing through the wavelength converting element 14. A portion of the fundamental laser beams 20 being reflected by the external resonator 16 are converted into the harmonic laser beams 34 by the wavelength converting element 14. Some of the fundamental laser beams 20 returning back to the light emitting element 24 are absorbed therein and changed into heat. However, most of them are effectively used by being used as an energy source for light emission or by being emitted from the light emitting element 24 after being reflected again within the light emitting element 24.

In this way, the fundamental laser beams 20 being emitted from the light emitting element 24 are amplified by the repetitive reflection between the light emitting element 24 and the external resonator 16. Because the external resonator 16 reflects only a portion (about 98 to 99%) of the laser beams having a predetermined narrow-band wavelength, the fundamental laser beams 20 are constituted by laser beams of a substantially single wavelength having a narrow wavelength band.

As described above, higher conversion efficiency is obtainable as the intensity of laser beams incident on the wavelength converting element 14 increases. Accordingly, by disposing the wavelength converting element 14 between the light emitting unit 10 and the external resonator 16, the fundamental laser beams 20 can be wavelength-converted with high efficiency. Thus, the harmonic laser beams 34 of which the wavelength is converted into a predetermined wavelength are outputted from the external resonator 16.

The base plate 18 has a flat attachment surface to which are disposed and fixed the support member 26, the prism assembly 44, the wavelength converting element assembly 50, and the external resonator assembly 54. A surface of the base plate 18 to which the light emitting unit 10 is disposed and fixed needs to have a highly precise flatness. Because the disposition portions of the wavelength converting element 14 and the external resonator 16 can be processed at the same time with the processing of the surface for a flat surface, these disposition portions on the base plate 18 can be finished with a highly precise flatness.

The base plate 18 can be made from copper having high heat conductivity. The base plate 18 may be formed of a heat conductor that conducts heat well. As the heat conductor, a metallic material including copper, brass, stainless steel, aluminum, indium, gold, silver, molybdenum, magnesium, nickel, and iron; diamond; or a member containing at least one of the materials mentioned above.

On the base plate 18, the light emitting element 10 is disposed and fixed by means of the support portion 26; the prism 12 is disposed and fixed by means of the prism assembly 44; the wavelength converting element 14 is disposed and fixed by means of the wavelength converting element assembly 50; and the external resonator 16 is disposed and fixed by means of the external resonator assembly 54. The base plate 18 is provided with the position determining members 46 and 56 that determines the position of the light emitting unit 10 relative to the light emitting element 24. On the base plate 18, the position determining members 46 and 56 for positioning are disposed on the basis of the light emitting element 24 of the light emitting unit 10. On the base plate 18, the prism 12 and the wavelength converting element 14, of which the positions are determined by the position determining member 46 are disposed and fixed. Also on the base plate 18, the external resonator 16 of which the position is determined by the position determining member 56 is disposed and fixed. With such an arrangement, it becomes easy to perform a position determining operation in an efficient manner. The position determining members 46 and 56 are configured as a pin. The assemblies 44, 50, and 54 are disposed on the base plate 18 and fixed thereto by means of adhesion or the like in the state in which the their positions are determined using corresponding pins, whereby the light source device 2 is completed. With such an arrangement, it becomes easy to perform a position determining operation in an efficient manner and at low cost.

According to such an arrangement, the use of the first optical element obviates the necessity of the long and thick convex portion or the L-shaped member for supporting the external resonator or the wavelength converting element. Moreover, the light emitting unit, the optical elements, and the external resonator are disposed and fixed to a base plate from the same direction, providing good workability at the time of manufacturing while decreasing manufacturing cycle time. In addition, the use of the second and third optical elements enables extraction of the harmonic laser beams returning back to the light emitting unit after being converted by the wavelength converting element in a more efficient manner without any attenuation of the harmonic laser beams due to a phenomenon such as absorption in the surface of the light emitting element; or reflection, scattering or absorption in surfaces of the wavelength converting element and the external resonator. Accordingly, it is possible to simplify the configuration of the light source device while decreasing the manufacturing cost. Also, the device can have a low profile and high efficiency.

Second Embodiment

Figure 4:
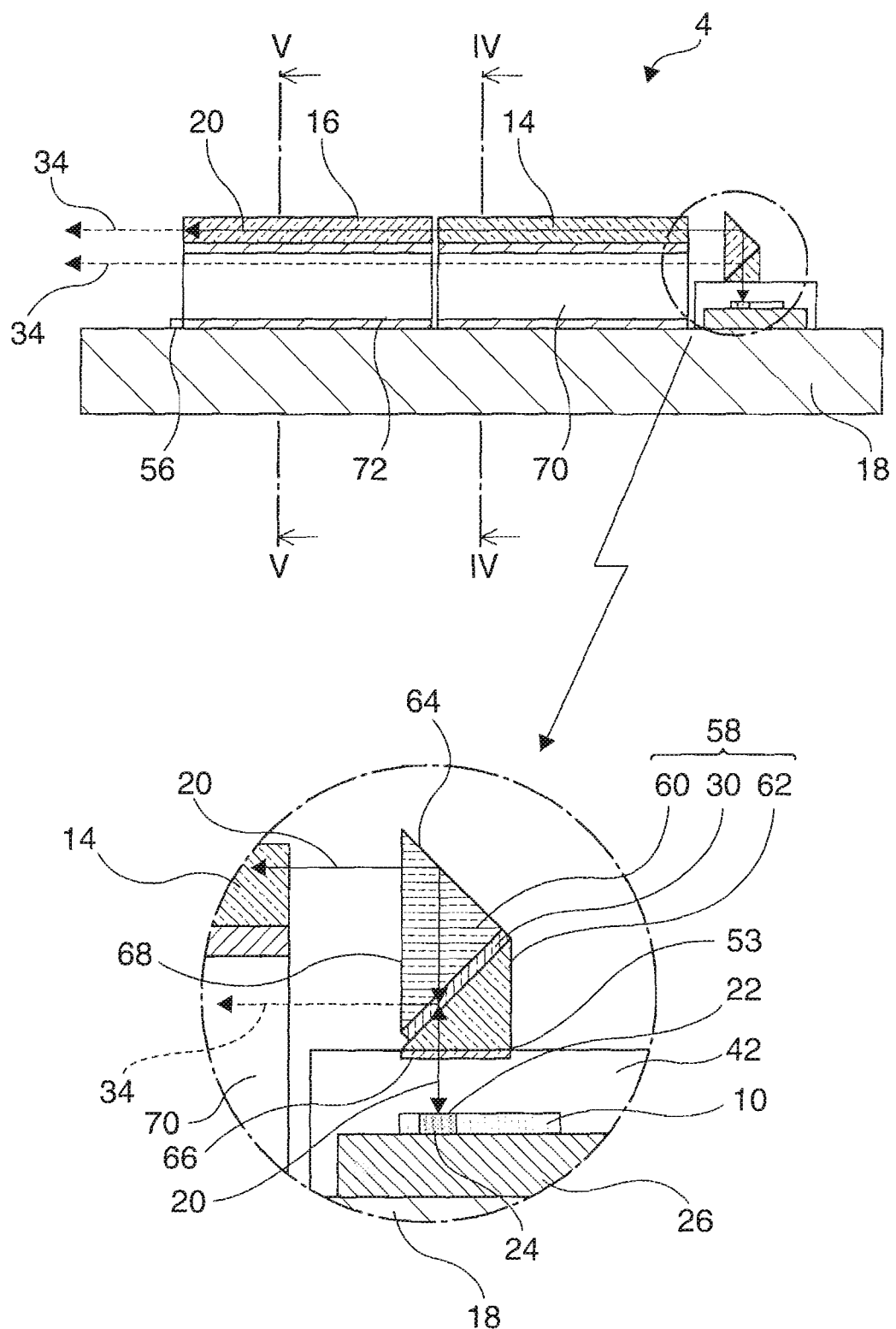
FIG. 4 shows a sectional view of a light source device in accordance with a second embodiment.
Figure 5:
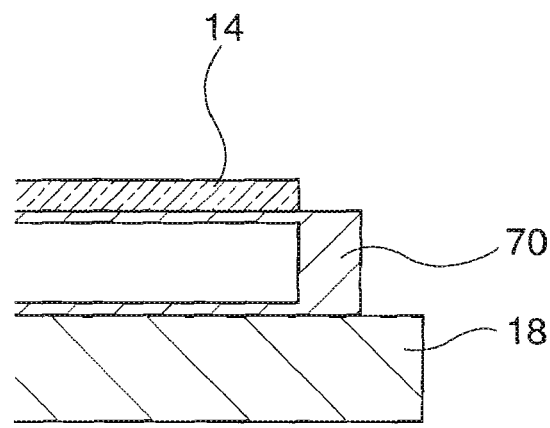
FIG. 5 shows a sectional view taken along the line IV-IV of FIG. 4.
Figure 6:
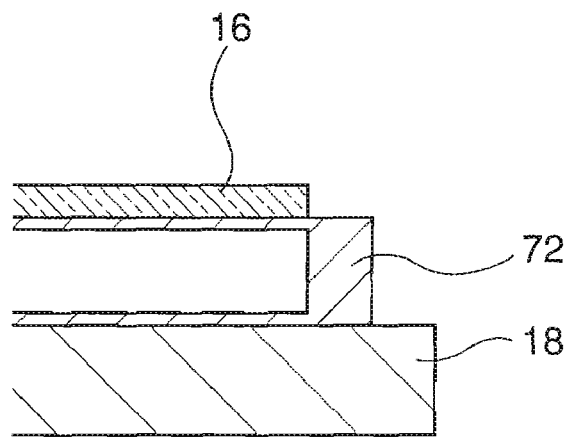
FIG. 6 shows a sectional view taken along the line V-V of FIG. 4.

FIG. 4 shows a sectional view of a light source device in accordance with a second embodiment. FIG. 5 shows a sectional view taken along the line IV-IV of FIG. 4. FIG. 6 shows a sectional view taken along the line V-V of FIG. 4. Incidentally, identical reference numeral will be attached to components identical with or similar to the first embodiment, and description thereof will be omitted. As shown in FIG. 4, the light source device 4 of the present embodiment includes a light emitting unit 10, an optical element 58, a wavelength converting element 14, an external resonator 16, and a base plate 18.

The optical element 58 includes a first prism 60 as a first optical element, a wavelength separating film 30 as a second optical element, and a second prism 62 as a third optical element.

The first prism 60 deflects a propagation direction of the fundamental laser beams 20 that are emitted from the light emitting unit 10 having one or more light emitting element 24 emitting the fundamental laser beams 20 in a direction vertical to the light emitting surface 22 toward a direction substantially parallel to a disposition surface of the light emitting unit 10.

The wavelength separating film 30 has a polarization selecting function for making the ratio of output beams to input beams of the fundamental laser beams 20 different from each other in two polarization components having different polarization directions.

The second prism 62 deflects the propagation direction of the harmonic laser beams 34 that are separated by the wavelength separating film 30 in a direction substantially parallel to the disposition surface of the light emitting unit 10 without needing to pass the harmonic laser beams 34 through the wavelength converting element 14 and the external resonator 16. A disposition surface of a spacer 42 of the second prism 62 is provided with an anti-reflection film 53 that suppress the fundamental laser beams 20 from being reflected from the optical element 58 when the fundamental laser beams 20 are incident on the optical element 58 after being emitted or reflected from the light emitting element 24.

The optical element 58 is a prism 58 constituted by the first prism 60 and the second prism 62 in which the first prism 60 and the second prism 62 are fixedly secured to each other with the wavelength separating film 30 disposed therebetween.

A laser beam reflecting surface of the prism 58 including the sectional side 64 of the prism 58 reflects the incident fundamental laser beams 20 and the harmonic laser beams 34 toward surfaces of the prism 58 including the remaining sides 66 and 68 in a direction vertical to the sides 66 and 68. The laser beam reflecting surface of the prism 58 including the sectional side 64 of the prism 58 may be provided with an optical film that reflects laser beams. The surface of the prism 58 including the sectional side 66 of the prism 58 is disposed and fixed to the base plate 18 by means of the spacer 42. The surface of the prism 58 including the sectional side 68 of the prism 58 is opposed to the wavelength converting element 14.

The laser beams reflected by the external resonator 16 are incident on the surface of the prism 58 including the sectional side 68 of the prism 58 and are then reflected from the laser reflective surface of the prism 58 including the sectional side 64 of the prism 58, whereby the reflected laser beams are separated into the harmonic laser beams 34 and the fundamental laser beams 20 by the wavelength separating film 30. The separated harmonic laser beams 34 are outputted from the surface of the prism 58 including the sectional side 68 of the prism 58. The outputted harmonic laser beams 34 propagate through a wavelength converting element holder 70 and an external resonator holder 72.

As shown in FIGS. 4 and 5, the wavelength converting element holder 70 has a cylindrical portion through which the harmonic laser beams 34 can pass. The wavelength converting element holder 70 has such a shape that the harmonic laser beams 34 are allowed to leak through the holder 70.

As shown in FIGS. 4 and 6, the external resonator holder 72 has a cylindrical portion through which the harmonic laser beams 34 can pass. The external resonator holder 72 has such a shape that the harmonic laser beams 34 are allowed to leak through the holder 72.

The wavelength separating film 30 provided in the prism 58 for separation of the wavelength-converted harmonic laser beams 34 makes it possible to extract the harmonic laser beams 34 without needing not only to guide the wavelength-converted harmonic laser beams 34 back to the light emitting element 24 but also to pass the harmonic laser beams 34 through the wavelength converting element 14 and the external resonator 16. Accordingly, it is possible to eliminate the effect of the harmonic laser beams 34 being absorbed into the surface of the light emitting element 24, thereby enabling to use the harmonic laser beams 34 in an efficient manner. Accordingly, it is possible to use the harmonic laser beams 34 in an efficient manner without any attenuation of the harmonic laser beams 34 due to a phenomenon such as surface reflection or scattering or absorption in surfaces which may be caused by the wavelength converting element 14 and the external resonator 16. The same statements as described in connection with the first embodiment can be applicable to other arrangements.

According to such an arrangement, the use of the first optical element obviates the necessity of the long and thick convex portion or the L-shaped member for supporting the external resonator or the wavelength converting element. Moreover, the light emitting unit, the optical elements, and the external resonator are disposed and fixed to a base plate from the same direction, providing good workability at the time of manufacturing while decreasing manufacturing cycle time. In addition, the use of the second and third optical elements enables extraction of the harmonic laser beams returning back to the light emitting unit after being converted by the wavelength converting element in a more efficient manner without any attenuation of the harmonic laser beams due to a phenomenon such as absorption in the surface of the light emitting element; or reflection, scattering or absorption in surfaces of the wavelength converting element and the external resonator. Accordingly, it is possible to simplify the configuration of the light source device while decreasing the manufacturing cost. Also, the device can have a low profile and high efficiency.

Third Embodiment

Figure 7:
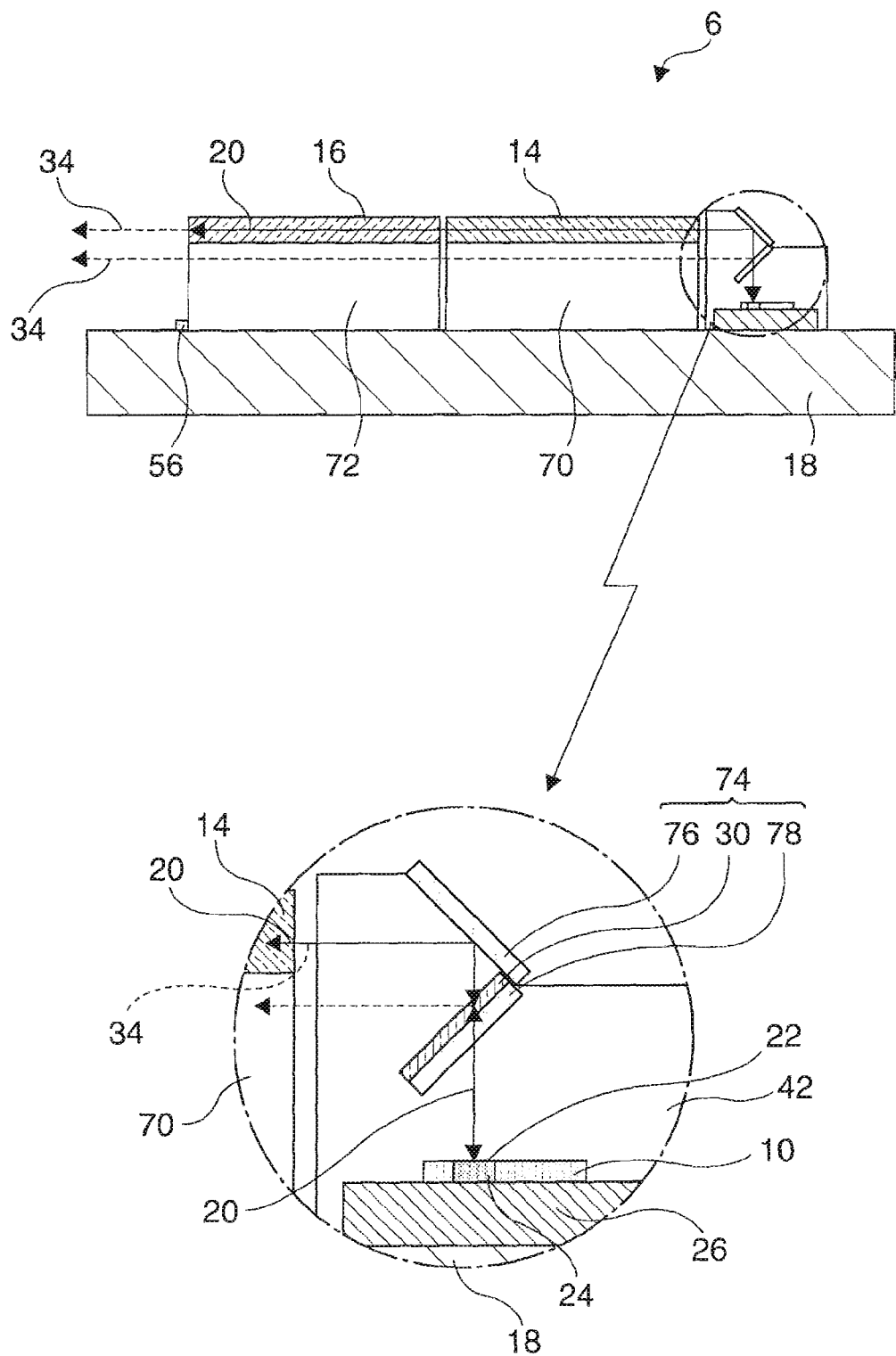
FIG. 7 shows a sectional view of a light source device in accordance with a third embodiment.

FIG. 7 shows a sectional view of a light source device in accordance with a third embodiment. Incidentally, identical reference numeral will be attached to components identical with or similar to the second embodiment, and description thereof will be omitted. As shown in FIG. 7, the light source device 6 of the present embodiment includes a light emitting unit 10, an optical element 74, a wavelength converting element 14, an external resonator 16, and a base plate 18.

The optical element 74 includes a first reflecting mirror (mirror) 76 as a first optical element, a wavelength separating film 30 as a second optical element, and a second reflecting mirror (mirror) 78 as a third optical element.

The first reflecting mirror 76 changes the propagation direction of the fundamental laser beams 20 emitted from the light emitting unit 10 and the harmonic laser beams 34 converted by the wavelength converting element 14. The first reflecting mirror 76 functions as an optical path converting member that changes the propagation direction of the fundamental laser beams 20 and the harmonic laser beams 34. Specifically, in the present embodiment, the first reflecting mirror 76 is disposed such that the fundamental laser beams 20 emitted from the light emitting element 24 and the harmonic laser beams 34 converted by the wavelength converting element 14 are reflected from the first reflecting mirror 76 so as to be deflected by about 90 degrees. The first reflecting mirror 76 changes the propagation direction of the harmonic laser beams 34 converted by the wavelength converting element 14 and the fundamental laser beams 20 incident on the first reflecting mirror 76 by about 90 degrees. The first reflecting mirror 76 is disposed such that a reflective surface is directed in a direction crossing the optical path of laser beams emitted from the light emitting element 24 at about 45 degrees.

The second reflecting mirror 78 allows the fundamental laser beams 20 emitted from the light emitting unit 10 to pass therethrough. The second reflecting mirror 78 has the wavelength separating film 30 formed on the surface thereof and changes the propagation direction of the harmonic laser beams 34 converted by the wavelength converting element 14. The wavelength separating film 30 formed on the surface of the second reflecting minor 78 allows the second reflecting mirror 78 to function as the optical path converting member that changes the propagation direction of the harmonic laser beams 34. Specifically, in the present embodiment, the second reflecting mirror 78 is disposed such that the harmonic laser beams 34 converted by the wavelength converting element 14 are reflected from the second reflecting mirror 78 so as to be deflected by about 90 degrees. The second reflecting mirror 78 changes the propagation direction of the harmonic laser beams 34 incident on the second reflecting mirror 78 by about 90 degrees. The second reflecting mirror 78 is disposed such that a reflective surface is directed in a direction crossing the optical path of laser beams emitted from the light emitting element 24 at about 45 degrees. With such an arrangement, it becomes easy to change the propagation direction of laser beams in an efficient manner and at low cost.

As the first reflecting mirror 76, existing mirrors such as one in which a reflective film made from metal such as aluminum is formed on a substrate formed, for example, of a glass or resin, or one in which a transparent panel made, for example, from a glass is stacked on the metallic reflective film are applicable. The second reflecting mirror 78 is formed by applying a dielectric multilayer film on a substrate formed, for example, of a glass or resin having optically transparent properties. The same statements as described in connection with the second embodiment can be applicable to other arrangements.

The wavelength separating film 30 has a polarization selecting function for making the ratio of output beams to input beams of the fundamental laser beams 20 different from each other in two polarization components having different polarization directions. Although in the present embodiment, the wavelength separating film 30 is provided with a polarization separating function, an optical film having the wavelength separating function may be separately provided to a surface of the first reflecting mirror 76 from which the fundamental laser beams 20 are reflected. Alternatively, the optical film having the wavelength separating function may be separately provided to a surface opposite the wavelength separating film 30 of the second reflecting mirror 78, through which the fundamental laser beams 20 are allowed to pass.

According to such an arrangement, the use of the first optical element obviates the necessity of the long and thick convex portion or the L-shaped member for supporting the external resonator or the wavelength converting element. Moreover, the light emitting unit, the optical elements, and the external resonator are disposed and fixed to a base plate from the same direction, providing good workability at the time of manufacturing while decreasing manufacturing cycle time. In addition, the use of the second and third optical elements enables extraction of the harmonic laser beams returning back to the light emitting unit after being converted by the wavelength converting element in a more efficient manner without any attenuation of the harmonic laser beams due to a phenomenon such as absorption in the surface of the light emitting element; or reflection, scattering or absorption in surfaces of the wavelength converting element and the external resonator. Accordingly, it is possible to simplify the configuration of the light source device while decreasing the manufacturing cost. Also, the device can have a low profile and high efficiency.

Fourth Embodiment

Figure 8:
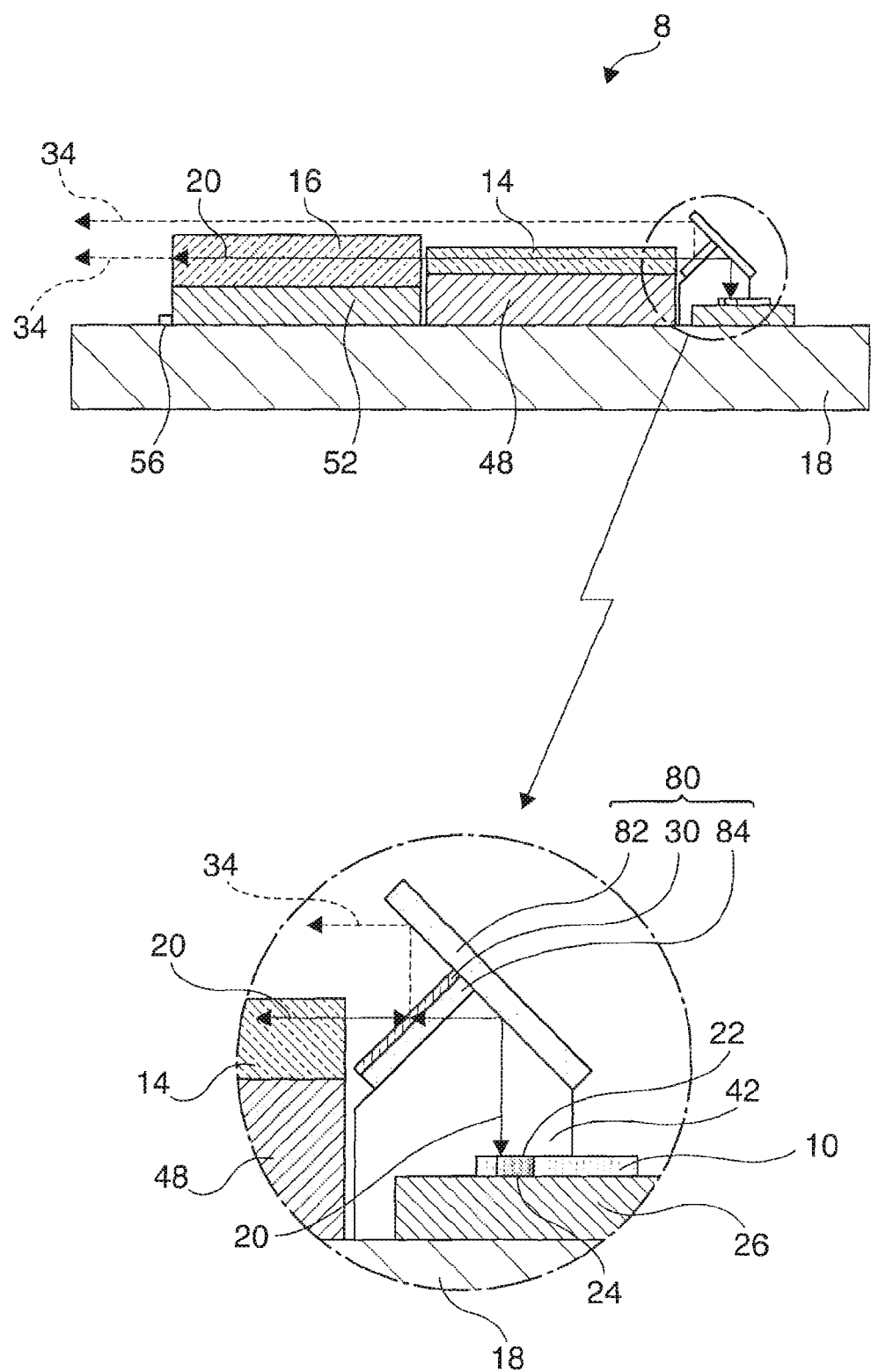
FIG. 8 shows a sectional view of a light source device in accordance with a fourth embodiment.

FIG. 8 shows a sectional view of a light source device in accordance with a fourth embodiment. Incidentally, identical reference numeral will be attached to components identical with or similar to the first embodiment, and description thereof will be omitted. As shown in FIG. 8, the light source device 8 of the present embodiment includes a light emitting unit 10, an optical element 80, a wavelength converting element 14, an external resonator 16, and a base plate 18.

The optical element 80 includes a first reflecting mirror (mirror) 82 as a first optical element, a wavelength separating film 30 as a second optical element, and a second reflecting mirror (mirror) 84 as a third optical element.

The first reflecting mirror 82 changes the propagation direction of the fundamental laser beams 20 emitted from the light emitting unit 10 and the harmonic laser beams 34 converted by the wavelength converting element 14. The first reflecting mirror 82 functions as an optical path converting member that changes the propagation direction of the fundamental laser beams 20 and the harmonic laser beams 34. Specifically, in the present embodiment, the first reflecting mirror 82 is disposed such that the fundamental laser beams 20 emitted from the light emitting element 24 and the harmonic laser beams 34 converted by the wavelength converting element 14 are reflected from the first reflecting mirror 82 so as to be deflected by about 90 degrees. The first reflecting mirror 82 changes the propagation direction of the harmonic laser beams 34 converted by the wavelength converting element 14 and the fundamental laser beams 20 incident on the first reflecting mirror 82 by about 90 degrees. The first reflecting mirror 82 is disposed such that a reflective surface is directed in a direction crossing the optical path of laser beams emitted from the light emitting element 24 at about 45 degrees.

The second reflecting mirror 84 allows the fundamental laser beams 20 emitted from the light emitting unit 10 to pass therethrough. The second reflecting mirror 84 has the wavelength separating film 30 formed on the surface thereof and changes the propagation direction of the harmonic laser beams 34 converted by the wavelength converting element 14. The wavelength separating film 30 formed on the surface of the second reflecting mirror 84 allows the second reflecting mirror 84 to function as the optical path converting member that changes the propagation direction of the harmonic laser beams 34. Specifically, in the present embodiment, the second reflecting mirror 84 is disposed such that the harmonic laser beams 34 converted by the wavelength converting element 14 are reflected from the second reflecting mirror 84 so as to be deflected by about 90 degrees. The second reflecting mirror 84 changes the propagation direction of the harmonic laser beams 34 incident on the second reflecting mirror 84 by about 90 degrees. The second reflecting mirror 84 is disposed such that a reflective surface is directed in a direction crossing the optical path of laser beams emitted from the light emitting element 24 at about 45 degrees. The same statements as described in connection with the first embodiment can be applicable to other arrangements.

The wavelength separating film 30 has a polarization selecting function for making the ratio of output beams to input beams of the fundamental laser beams 20 different from each other in two polarization components having different polarization directions. Although in the present embodiment, the wavelength separating film 30 is provided with a polarization separating function, an optical film having the wavelength separating function may be separately provided to a surface opposite the wavelength separating film 30 of the second reflecting mirror 84, through which the fundamental laser beams 20 are allowed to pass.

According to such an arrangement, the use of the first optical element obviates the necessity of the long and thick convex portion or the L-shaped member for supporting the external resonator or the wavelength converting element. Moreover, the light emitting unit, the optical elements, and the external resonator are disposed and fixed to a base plate from the same direction, providing good workability at the time of manufacturing while decreasing manufacturing cycle time. In addition, the use of the second and third optical elements enables extraction of the harmonic laser beams returning back to the light emitting unit after being converted by the wavelength converting element in a more efficient manner without any attenuation of the harmonic laser beams due to a phenomenon such as absorption in the surface of the light emitting element; or reflection, scattering or absorption in surfaces of the wavelength converting element and the external resonator. Accordingly, it is possible to simplify the configuration of the light source device while decreasing the manufacturing cost. Also, the device can have a low profile and high efficiency.

Fifth Embodiment

Figure 9:
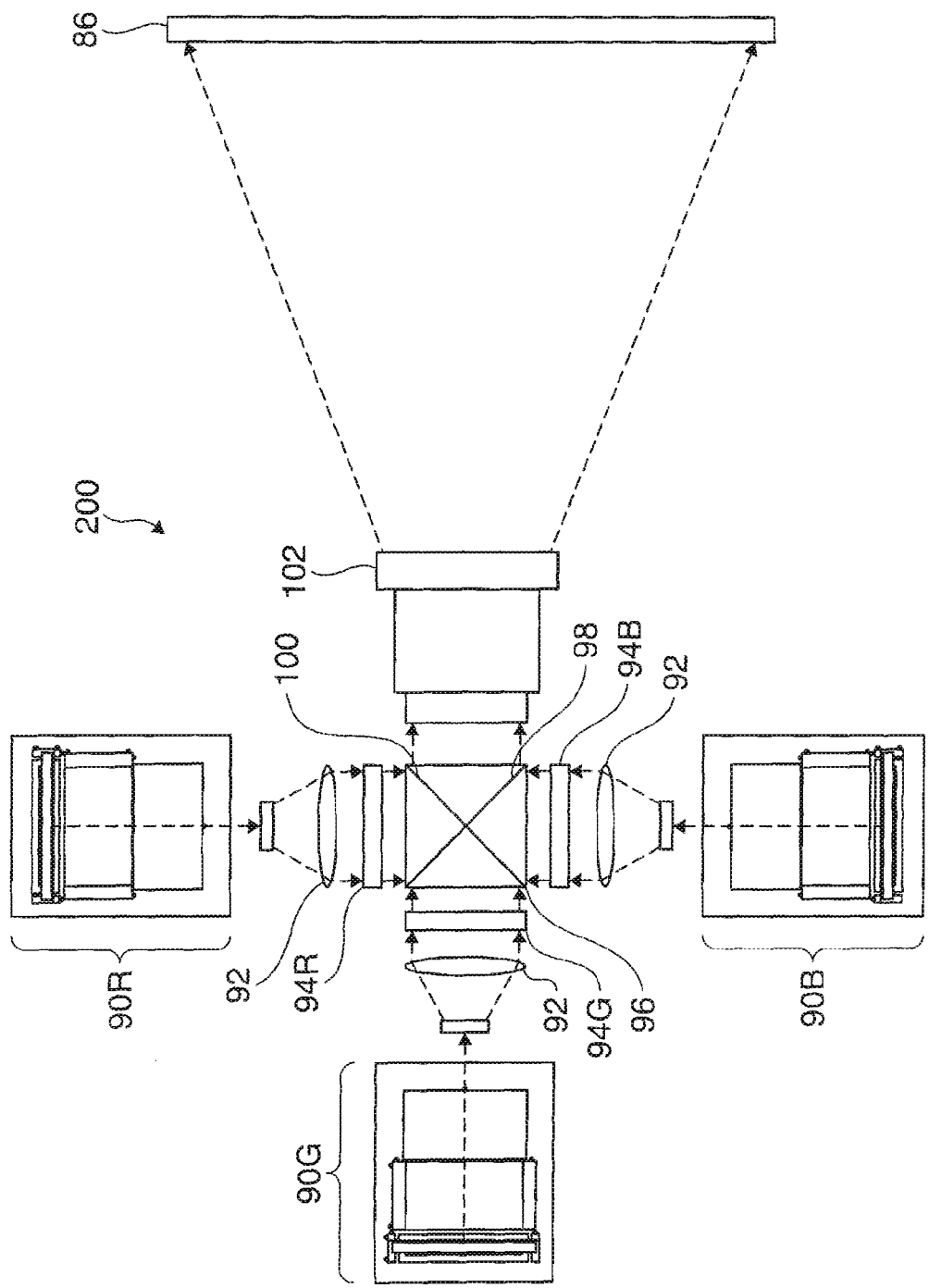
FIG. 9 shows a view of an image display apparatus in accordance with a fifth embodiment.

FIG. 9 shows a sectional view of an image display apparatus in accordance with a fifth embodiment. In the present embodiment, an image display apparatus 200 having the light source device 2 of the first embodiment will be described. For the sake of simple explanation, a case of the image display apparatus 200 is not illustrated in FIG. 9. Incidentally, descriptions of components identical with or similar to the first embodiment will be omitted. The image display apparatus 200 of the present embodiment is a front projection type projector in which laser beams are supplied onto a screen 86 and images are viewed by observing the laser beams reflected from the screen 86. The image display apparatus 200 includes color laser light source devices having the same configuration as the light source device 2 (see FIG. 1). Specifically, the image display apparatus 200 includes a red laser light source (light source device) 90R emitting a red laser beam, a green laser light source (light source device) 90G emitting a green laser beam, and a blue laser light source (light source device) 90B emitting a blue laser beam. The image display apparatus 200 displays images using the laser beams from the color laser light sources 90R, 90G, and 90B.

The red laser light source 90R supplies a red laser beam. A field lens 92 collimates the red laser beam from the red laser light source 90R so as to be incident on a spatial light modulating device 94R for a red laser beam. The spatial light modulating device 94R for a red laser beam is a transmission type liquid crystal display device that modulates the red laser beam in accordance with image signals. The red laser beam modulated by the spatial light modulating device 94R for a red laser beam is incident on a cross dichroic prism 96 which is a color combining optical system.

The green laser light source 90G supplies a green laser beam. The field lens 92 collimates the green laser beam from the green laser light source 90G so as to be incident on a spatial light modulating device 94G for a green laser beam. The spatial light modulating device 94G for a green laser beam is a transmission type liquid crystal display device that modulates the green laser beam in accordance with image signals. The green laser beam modulated by the spatial light modulating device 94G for a green laser beam is incident on the cross dichroic prism 96 in a direction opposite to that of the red laser beam.

The blue laser light source 90B supplies a blue laser beam. The field lens 92 collimates the blue laser beam from the blue laser light source 90B so as to be incident on a spatial light modulating device 94B for a blue laser beam. The spatial light modulating device 94B for a blue laser beam is a transmission type liquid crystal display device that modulates the blue laser beam in accordance with image signals. The blue laser beam modulated by the spatial light modulating device 94B for a blue laser beam is incident on the cross dichroic prism 96 in a direction opposite to that of the red and green laser beams.

The cross dichroic prism 96 is formed by attaching four right angle prisms to each other. First and second dichroic films 98 and 100 are formed in the inner surface of the cross dichroic prism 96 so as to cross each other at about the right angle. The first dichroic film 98 reflects the red laser beam and transmits the green and blue laser beams. The second dichroic film 100 reflects the blue laser beam and transmits the red and green laser beams. The cross dichroic prism 96 combines the red, green, and blue laser beams incident thereon from different directions and outputs the combined laser beams in a direction toward a projection lens 102. The projection tens 102 projects the combined laser beams outputted from the cross dichroic prism 96 in a direction toward the screen 86. The projector may be a rear projection type projector in which laser beams are supplied onto one side of a screen and images are viewed by observing the laser beams outputted from the other surface of the screen. The spatial light modulating device used is not limited to the transmission type liquid crystal display device, but a reflection type liquid crystal display device (LCOS: Liquid Crystal On Silicon), a DMD (Digital Micro mirror Device), a GLV (Grating Light Valve), or the like may be used.

According to such an arrangement, the use of the first optical element obviates the necessity of the long and thick convex portion or the L-shaped member. Moreover, the light emitting unit, the optical elements, and the external resonator are disposed and fixed to a base plate from the same direction, providing good workability at the time of manufacturing while decreasing manufacturing cycle time. In addition, the use of the second and third optical elements enables extraction of the harmonic laser beams returning back to the light emitting unit after being converted by the wavelength converting element in a more efficient manner without needing to pass the harmonic laser beams through the wavelength converting element and the external resonator. Accordingly, it is possible to simplify the configuration of the image display apparatus while decreasing the manufacturing cost. Also, the apparatus can have a low profile and high efficiency.

Sixth Embodiment

The light source devices 2, 4, 6, and 8 of the first to fourth embodiments are applicable to a scanning type image display apparatus.

Figure 10:
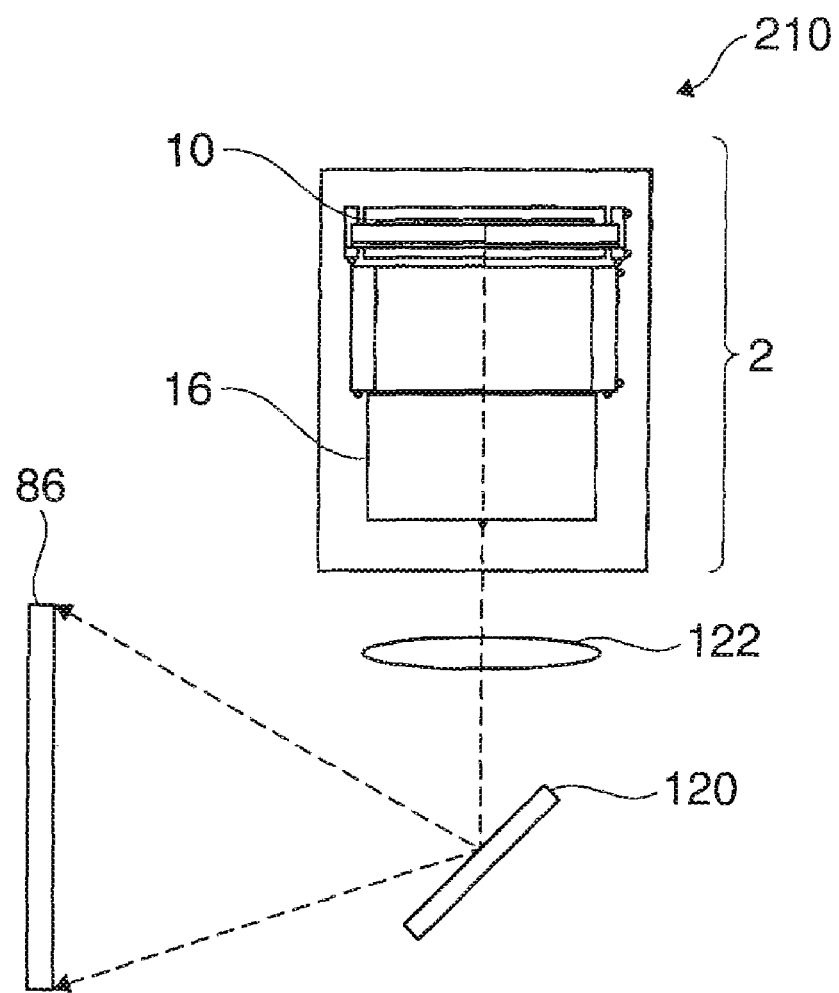
FIG. 10 shows a view of an image display apparatus in accordance with a sixth embodiment.
Figure 11:
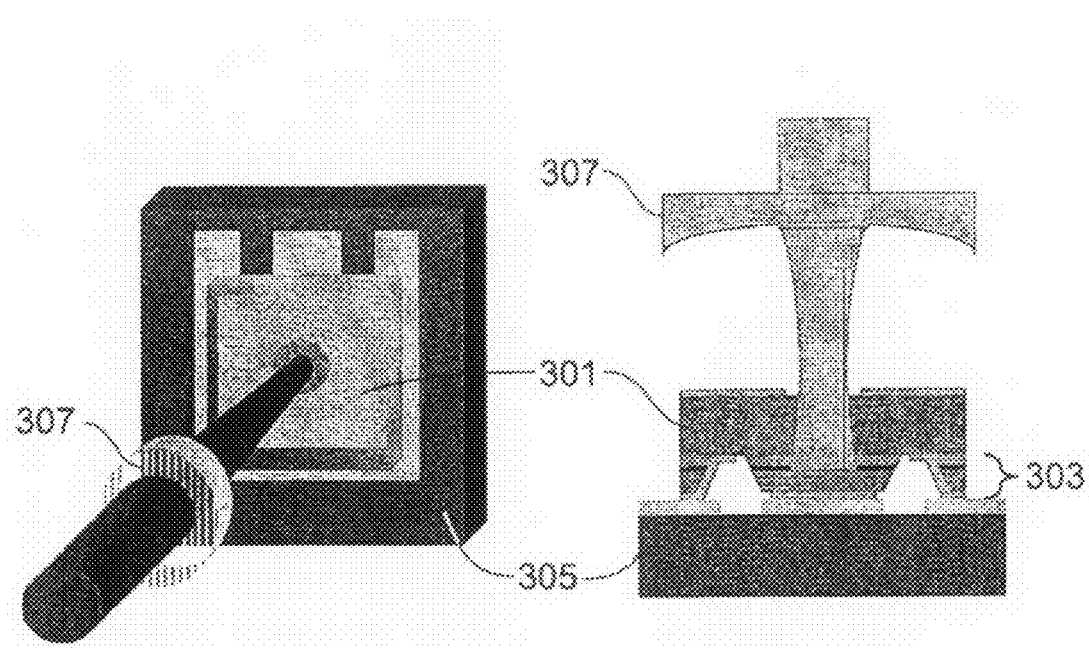
FIG. 11 shows a view of a light source device known in the art.

FIG. 10 shows a view of an image display apparatus in accordance with a sixth embodiment. In the present embodiment, an image display apparatus 210 having the light source device 2 of the first embodiment will be described. The image display apparatus 210 of the present embodiment includes the light source device 2 of the first embodiment, a MEMS mirror (scanning unit) 120 that scans the laser beams emitted from the light source device 2 so as to be guided toward the screen 86, and a collector lens 122 that collects the laser beams emitted from the light source device 2 so as to be focused on the MEMS mirror 120. With the movement of the MEMS mirror 120, the laser beams emitted from the light source device 2 are guided to the screen 86 so that the laser beams are scanned over the screen 86 in vertical and horizontal direction. For color image display, the plurality of light emitting elements 24 (see FIG. 2) of the light emitting unit 10 may be configured as a combination of the light emitting elements 24 having peak wavelengths corresponding to the red, green, and blue colors.

According to such an arrangement, the use of the first optical element obviates the necessity of the long and thick convex portion or the L-shaped member. Moreover, the light emitting unit, the optical elements, and the external resonator are disposed and fixed to a base plate from the same direction, providing good workability at the time of manufacturing while decreasing manufacturing cycle time. In addition, the use of the second and third optical elements enables extraction of the harmonic laser beams returning back to the light emitting unit after being converted by the wavelength converting element in a more efficient manner without needing to pass the harmonic laser beams through the wavelength converting element and the external resonator. Accordingly, it is possible to simplify the configuration of the image display apparatus while decreasing the manufacturing cost. Also, the apparatus can have a low profile and high efficiency.

What is claimed is:

1. A light source device, comprising:
a light emitting unit that has one or more light emitting element emitting fundamental laser beams in a direction vertical to a light emitting surface;
a first optical element that deflects a propagation direction of the fundamental laser beams emitted from the light emitting unit toward a direction substantially parallel to a disposition surface of the light emitting unit;
a wavelength converting element that is disposed on an optical path of the fundamental laser beams having passed the first optical element so as to convert at least a portion of the fundamental laser beams into harmonic laser beams;
an external resonator that selects the fundamental laser beams among those having passed the wavelength converting element so that the fundamental laser beams selected are reflected toward the first optical element and guided back to the light emitting unit, thereby functioning as a resonator mirror for the light emitting unit, while allowing the harmonic laser beams to pass therethrough;
a second optical element that separates those laser beams having passed the wavelength converting element after being reflected from the external resonator into the harmonic laser beams that are converted by the wavelength converting element and the fundamental laser beams; and
a third optical element that deflects the propagation direction of the harmonic laser beams that are separated by the second optical element toward a direction substantially parallel to the disposition surface of the light emitting unit,
the second optical element being a wavelength separating film,
the wavelength separating film having a polarization selecting function for making a ratio of output beams to input beams of the fundamental laser beams different from each other in two polarization components having different polarization directions, and
the polarization direction associated with a higher ratio in the polarization selecting function of the wavelength separating film being substantially identical to a polarization direction of the wavelength converting element,
the wavelength separating film having a polarization selecting function in which a difference between two polarization components of a fundamental wavelength is greater than a difference between two polarization components of a converted wavelength.

2. The light source device according to claim 1,
the first optical element being a first prism having an isosceles right triangular section,
the third optical element being a second prism having an isosceles right triangular section, and
the first prism and the second prism being fixedly secured to each other with the wavelength separating film disposed therebetween.

3. The light source device according to claim 2,
a surface on the light emitting element side of the first prism being provided with an anti-reflection film that suppress the fundamental laser beams from being reflected from the first prism when the fundamental laser beams are incident on the first prism after being emitted or reflected from the light emitting element.

4. The light source device according to claim 1, the first and third optical elements being configured as a mirror.

5. The light source device according to claim 1, further comprising a position determining member disposed on the disposition surface of the light emitting unit, the position determining member determining the positions of the first to third optical elements, the wavelength converting element and the external resonator relative to the light emitting element of the light emitting unit.

6. The light source device according to claim 5, the position determining member being a pin.

7. An image display apparatus, comprising:
the light source device according to claim 1;
a light modulating device that modulates laser beams emitted from the light source device in accordance with image signals; and
a projecting device that projects images formed by the light modulating device.

8. An image display apparatus, comprising:
the light source device according to claim 1; and
a scanning unit that scans the harmonic laser beams emitted from the light source device on a projection surface.

9. An optical device, comprising:
a first optical element that deflects a propagation direction of at least one or more first laser beams toward a direction substantially incident to the propagation direction of the at least one or more first laser beams prior to deflection;
a wavelength converting element that is disposed on an optical path of the one or more first laser beams having passed the first optical element so as to convert at least a portion of the one or more first laser beams into second laser beams
a second optical element that separates those laser beams having passed the wavelength converting element into the first laser beams and at least one or more of the second laser beams; and
a third optical element that deflects a propagation direction of the at least one or more second laser beams that are separated by the second optical element toward a direction substantially parallel to the propagation direction of the at least one or more first laser beams deflected by the first optical element,
the second optical element being a wavelength separating film,
the wavelength separating film having a polarization selecting function for making a ratio of output beams to input beams of the first laser beams different from each other in two polarization components having different polarization directions, and
the polarization direction associated with a higher ratio in the polarization selecting function of the wavelength separating film being substantially identical to a polarization direction of the wavelength converting element,
the wavelength separating film having a polarization selecting function in which a difference between two polarization components of a fundamental wavelength is greater than a difference between two polarization components of a converted wavelength.

10. The optical device according to claim 9, the at least one or more first laser beams being fundamental laser beams.

11. The optical device according to claim 9, the at least one or more second laser beams being laser beams harmonic to the first laser beams.

12. The optical device according to claim 9, the at least one or more second laser beams being harmonic conversions of the at least one or more first laser beams.

13. The light source device according to claim 9, the first optical element being a first prism having an isosceles right triangular section,
the third optical element being a second prism having an isosceles right triangular section, and
the first prism and the second prism being fixedly secured to each other with the wavelength separating film disposed therebetween.

14. The light source device according to claim 9, the first and third optical elements being configured as a mirror.

15. A method for extracting selected light emitted from a light source device, the method comprising:
emitting at least one or more fundamental laser beams in a direction substantially perpendicular to a light emitting surface;
deflecting the at least one or more fundamental laser beams toward a direction substantially parallel to the light emitting surface;
converting, with a wavelength converting element, at least a portion of the at least one or more fundamental laser beams into at least one or more harmonic laser beams;
reflecting back at least a remaining portion of at least one or more fundamental laser beams, that have not been converted into at least one or more harmonic laser beams, toward a direction substantially parallel to the light emitting surface and then deflecting the at least one or more fundamental laser beams in a direction substantially vertical and toward the light emitting surface;
converting, with the wavelength converting element, at least a portion of the reflected back remaining portion of the at least one or more fundamental laser beams into at least one or more harmonic laser beams;
separating, with a wavelength separating film, the reflected back laser beams into at least one or more fundamental laser beams and at least one or more harmonic laser beams; and
deflecting the at least one or more harmonic laser beams that have been separated toward a direction substantially parallel to the light emitting surface,
the wavelength separating film having a polarization selecting function for making a ratio of output beams to input beams of the fundamental laser beams different from each other in two polarization components having different polarization directions, and
the polarization direction associated with a higher ratio in the polarization selecting function of the wavelength separating film being substantially identical to a polarization direction of the wavelength converting element
the wavelength separating film having a polarization selecting function in which a difference between two polarization components of a fundamental wavelength is greater than a difference between two polarization components of a converted wavelength.

16. A method for extracting selected light emitted from an optical device, the method comprising:
deflecting at least one or more first laser beams emitted in a direction substantially perpendicular to a light emitting surface, toward a direction substantially parallel to the light emitting surface;

converting, with a wavelength converting element, at least a portion of the at least one or more first laser beams into at least one or more second laser beams;

separating, with a wavelength separating film, deflected laser beams that have been reflected back into at least one or more of the first laser beams and at least one or more of the second laser beams; and deflecting the at least one or more second laser beams that have been separated toward a direction substantially parallel to the light emitting surface, the wavelength separating film having a polarization selecting function for making a ratio of output beams to input beams of the fundamental laser beams different from each other in two polarization components having different polarization directions, and the polarization direction associated with a higher ratio in the polarization selecting function of the wavelength separating film being substantially identical to a polarization direction of the wavelength converting element, the wavelength separating film having a polarization selecting function in which a difference between two polarization components of a fundamental wavelength is greater than a difference between two polarization components of a converted wavelength.

* * * * *